United States Patent
Wandres et al.

(10) Patent No.: US 10,439,607 B2
(45) Date of Patent: Oct. 8, 2019

(54) CIRCUIT BREAKER DEVICE, ESPECIALLY FOR A VEHICLE ELECTRICAL SYSTEM

(71) Applicant: Eberspächer Controls Landau GmbH & Co. KG, Landau (DE)

(72) Inventors: Steffen Wandres, Kandel (DE); Christian Knopf, St. Leon-Rot (DE)

(73) Assignee: Eberspächer Controls Landau GmbH & Co. KG, Landau (DE)

( * ) Notice: Subject to any disclaimer, the term of this patent is extended or adjusted under 35 U.S.C. 154(b) by 141 days.

(21) Appl. No.: 15/661,499

(22) Filed: Jul. 27, 2017

(65) Prior Publication Data
US 2018/0034461 A1 Feb. 1, 2018

(30) Foreign Application Priority Data
Jul. 29, 2016 (DE) .................. 10 2016 114 002

(51) Int. Cl.
| | |
|---|---|
| *H03K 17/687* | (2006.01) |
| *B60R 16/03* | (2006.01) |
| *H03K 17/74* | (2006.01) |
| *H02J 7/00* | (2006.01) |
| *H02H 3/24* | (2006.01) |

(52) U.S. Cl.
CPC ......... *H03K 17/6871* (2013.01); *B60R 16/03* (2013.01); *H02H 3/243* (2013.01); *H02J 7/0034* (2013.01); *H03K 17/74* (2013.01)

(58) Field of Classification Search
CPC .... H03K 17/6871; H03K 17/74; B60R 16/03; H02H 3/243; H02J 7/0034
See application file for complete search history.

(56) References Cited

U.S. PATENT DOCUMENTS

| | | | |
|---|---|---|---|
| 3,829,708 A | 8/1974 | Grunleitner et al. | |
| 2006/0126245 A1* | 6/2006 | Grose | H02H 11/002 361/82 |
| 2007/0274110 A1 | 11/2007 | Kitamura et al. | |
| 2015/0002125 A1 | 1/2015 | Kinoshita et al. | |

(Continued)

FOREIGN PATENT DOCUMENTS

| | | |
|---|---|---|
| DE | 10 2006 006 878 A1 | 7/2007 |
| DE | 10 2010 051 874 A1 | 5/2012 |
| DE | 10 2010 054 402 A1 | 6/2012 |

(Continued)

*Primary Examiner* — Robert L Deberadinis
(74) *Attorney, Agent, or Firm* — McGlew and Tuttle, P.C.

(57) ABSTRACT

A circuit breaker device includes at least one circuit breaker component with an input terminal (18), an output terminal (22) and with a driving terminal (26). The circuit breaker component (14) is in a conductor state when driving voltage is applied to the driving terminal (26) and is in a diode state when driving voltage is not applied thereto, resulting in a component blocked state when the input terminal (18) is at a higher potential than the output terminal (22). A driving unit (30) provides a driving voltage to the driving terminal. An auxiliary driving unit (38) provides an auxiliary driving voltage to the driving terminal (26). The auxiliary driving unit (38) generates the auxiliary driving voltage based on a voltage drop between the input terminal and the output terminal in the diode state and the circuit breaker component output terminal is at a higher potential than the input terminal.

20 Claims, 1 Drawing Sheet

(56) References Cited

U.S. PATENT DOCUMENTS

2015/0109706 A1    4/2015   Iwamizu
2016/0209855 A1    7/2016   Deboy

FOREIGN PATENT DOCUMENTS

| DE | 10 2014 108783 A1 | 12/2014 |
| DE | 10 2016 101 081 A1 | 7/2017 |
| EP | 0 717 497 A2 | 6/1996 |
| EP | 1 860 774 A1 | 11/2007 |
| EP | 2 017 935 A2 | 1/2009 |
| EP | 2 131 497 A1 | 12/2009 |
| EP | 2 360 807 A1 | 8/2011 |

* cited by examiner

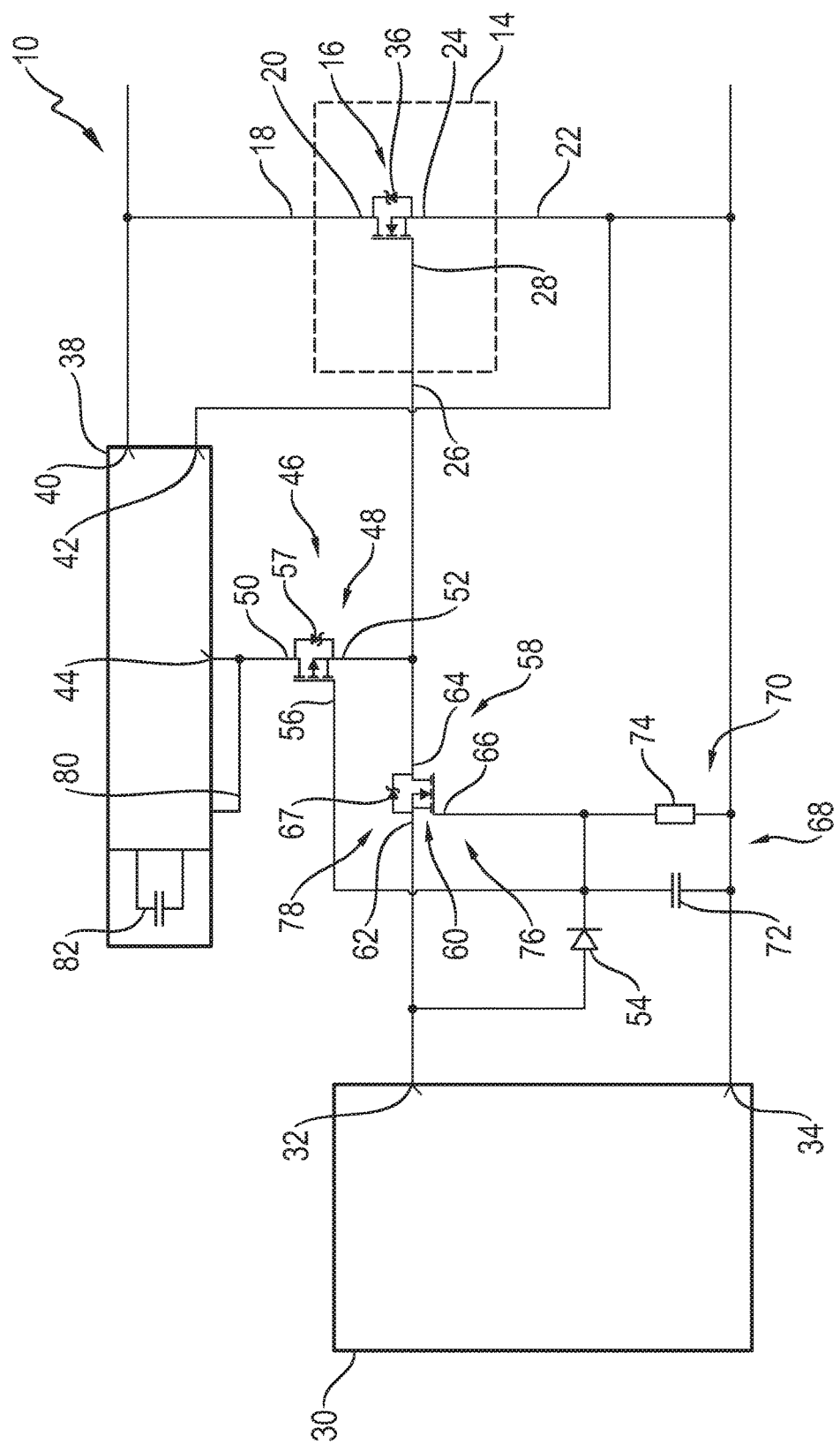

CIRCUIT BREAKER DEVICE, ESPECIALLY FOR A VEHICLE ELECTRICAL SYSTEM

CROSS REFERENCE TO RELATED APPLICATIONS

This application claims the benefit of priority under 35 U.S.C. § 119 of German Application DE 10 2016 114 002.3 filed Jul. 29, 2016, the entire contents of which are incorporated herein by reference.

FIELD OF THE INVENTION

The present invention pertains to a circuit breaker device, especially for a vehicle electrical system.

BACKGROUND OF THE INVENTION

An electrical system for a vehicle, in which two voltage sources can be coupled with a plurality of consumers of electrical energy, e.g., by means of two circuit breaker components marketed by the Applicant of the present application under the trade name Q diode (quasi diode) as a function of the operating state, is known from the subsequently published German Patent Application DE 10 2016 101 081. A driving unit applying a driving voltage to the circuit breaker components as a function of the operating state is provided for switching circuit breaker components which can be switched over between a conductor state and a diode state.

EP 2 017 935 A2 discloses a circuit breaker component for a vehicle electrical system, which has a circuit breaker component input terminal, a circuit breaker component output terminal as well as a circuit breaker component driving terminal, to which the driving voltage switching over the circuit breaker component between the conductor state and a diode state is to be applied.

If such circuit breaker components are operated in a diode state, then these are in a blocked state when the potential being applied to the circuit breaker component input terminal is higher than the potential being applied to the circuit breaker component output terminal. The potential being applied to a circuit breaker component input terminal may, for example, essentially be determined by the supply voltage of a battery feeding an electrical system with electrical energy. In principle, operating states may occur, in which the potential at the circuit breaker component output terminal is higher than the potential at the circuit breaker component input terminal because of a malfunction or an operating error in the diode state of a circuit breaker component. As a result, the circuit breaker component, which is operated, in principle, in its diode state, reaches a conductive state, in which a current flow takes place from the circuit breaker component output terminal to the circuit breaker component input terminal in case of a comparatively low voltage drop. In this state, currents of up to 30 A may flow, which may lead to a comparatively high power loss and accordingly to a comparatively intense heating and thus to damage to such a component, because of the voltage drop present.

SUMMARY OF THE INVENTION

An object of the present invention is to provide a circuit breaker device, especially for a vehicle electrical system, which spontaneously activates a protective function avoiding an excessive heating when error states or misuse states occur.

According to the present invention, this object is accomplished by a circuit breaker device, especially for a vehicle electrical system, comprising: at least one circuit breaker component with a circuit breaker component input terminal, with a circuit breaker component output terminal and with a circuit breaker component driving terminal, wherein the circuit breaker component is in a conductor state when driving voltage is applied to the circuit breaker component driving terminal and the circuit breaker component is in a diode state when driving voltage is not applied to the circuit breaker component driving terminal such that the circuit breaker component is in a blocked state when the circuit breaker component input terminal is at a higher potential than the circuit breaker component output terminal, a driving unit for providing a driving voltage to be applied to the circuit breaker component driving terminal, and an auxiliary driving unit for providing an auxiliary driving voltage to be applied to the circuit breaker component driving terminal, wherein the auxiliary driving unit is configured to generate the auxiliary driving voltage on the basis of a voltage drop between the circuit breaker component input terminal and the circuit breaker component output terminal when the circuit breaker component is in its diode state and the circuit breaker component output terminal is at a higher potential than the circuit breaker component input terminal.

In case of a circuit breaker device configured according to the present invention, if a state occurs, in which a circuit breaker component is in its diode state because of the potential difference present but not in its blocked state, but rather in a conductive state or on state, an auxiliary driving voltage is provided, which is applied to the circuit breaker component driving terminal and thus switches the circuit breaker component into its conductor state. Because the electrical resistance and thus also the voltage drop are markedly lower in the circuit breaker component in this conductor state than in a state in which the circuit breaker component is conductive in its diode state, a lower power loss is generated, with the result that excessive heating and thus damage to the circuit breaker component can be avoided.

In an embodiment that is especially advantageous for conducting strong currents, provisions may be made for the circuit breaker component to comprise a circuit breaker MOSFET component, wherein the circuit breaker component driving terminal corresponds to the gate terminal of the circuit breaker MOSFET component, the circuit breaker component input terminal corresponds to the drain terminal of the circuit breaker component MOSFET component and the circuit breaker component output terminal corresponds to the source terminal of the circuit breaker MOSFET component. For example, an n-channel MOSFET may be used here, which can be brought into its conductor state by applying a positive voltage or a positive potential to its gate terminal.

In this case, it should be pointed out that, for example, the gate terminal, the drain terminal and the source terminal of such a component can directly provide the driving terminal, the input terminal and the output terminal, respectively, of the circuit breaker component. As an alternative, for example, when the circuit breaker component is configured as a so-called Q diode, the driving terminal or/and the input terminal or/and the output terminal can be connected to the gate terminal, the drain terminal and the source terminal, respectively, of such a component via other components which are active in terms of circuitry.

In order to be able to provide the driving voltage or the auxiliary driving voltage or a corresponding potential to be applied to the circuit breaker component driving terminal, it is proposed that the driving unit have a first driving unit output terminal for applying the driving voltage to the circuit breaker component driving terminal, or/and that the auxiliary driving unit have an auxiliary driving unit output terminal for applying the auxiliary driving voltage to the circuit breaker component driving terminal.

Especially in cases, in which the auxiliary driving voltage to be provided by the auxiliary driving unit is lower than the driving voltage to be provided by the driving unit and if a disturbance or damage could occur in the area of the auxiliary driving unit when driving voltage is applied, it is proposed that a first decoupling circuit component be associated with the auxiliary driving unit output terminal, wherein the first decoupling circuit component decouples the auxiliary driving unit output terminal from the circuit breaker component driving terminal when the driving voltage provided by the driving unit is applied to the circuit breaker component driving terminal.

For an embodiment which is structurally simple to implement, provisions may be made here for the first decoupling circuit component to comprise a first decoupling MOSFET component, the gate terminal of which is connected to the first driving unit output terminal preferably via a diode, the drain terminal of which is connected to the auxiliary driving unit output terminal and the source terminal of which is connected to the circuit breaker component driving terminal. For example, a p-channel MOSFET can be used here. It should be pointed out that if a diode state is being referred to in connection with a MOSFET in the context of the present invention, the state thus addressed is the state in which the transistor is not, in principle, switched into a conductive state, but it does act, because of the intrinsic diode nevertheless present in same, as a diode when a corresponding potential difference is applied, either in the blocked direction or in the forward conducting direction.

To be able to detect the potential difference present between the circuit breaker component input terminal and the circuit breaker component output terminal and accordingly, if necessary, to generate the auxiliary driving voltage and to be able to apply same to the circuit breaker component driving terminal, it is proposed that the auxiliary driving unit have a first auxiliary driving unit input terminal connected to the circuit breaker component input terminal and a second auxiliary driving unit input terminal connected to the circuit breaker component output terminal.

For generating a sufficiently high auxiliary driving voltage, provisions may further be made for the auxiliary driving unit to be configured to multiply the potential difference present between the two auxiliary driving unit input terminals or the voltage being applied thereto for providing the auxiliary driving voltage.

To be able to apply the potential difference needed for switching the circuit breaker component by the driving unit between two terminals of the circuit breaker component, it is proposed that the driving unit have a second driving unit output terminal connected to the circuit breaker component output terminal.

Should the circuit breaker component be brought into its diode state, starting from its conductor state, it is generally necessary to discharge a capacitance built up in the area of the circuit breaker component driving terminal. It is hence proposed that a discharge circuit component be associated with the circuit breaker component driving terminal, wherein the discharge circuit component is arranged between the first driving unit output terminal and the circuit breaker component driving terminal and the driving unit applies the driving voltage via the discharge circuit component to the circuit breaker component driving terminal, and wherein the circuit breaker component driving terminal can be discharged via the discharge circuit component when driving voltage is not provided by the driving unit.

Hence, it is proposed that a discharge circuit component be associated with the circuit breaker component driving terminal, wherein the discharge circuit component is arranged between the first driving unit output terminal and the circuit breaker component driving terminal and the driving unit applies the driving voltage to the circuit breaker component driving terminal via the discharge circuit component, and wherein the circuit breaker component driving terminal can be discharged via the discharge circuit component when driving voltage is not provided by the driving unit.

For an embodiment which is simple to implement, it is also proposed here that the discharge circuit component comprise a discharge MOSFET component, the gate terminal of which is connected to the first driving unit output terminal preferably via a diode, the source terminal of which is connected to the first driving unit output terminal and the drain terminal of which is connected to the circuit breaker component driving terminal, wherein the discharge MOSFET component is in its diode state when driving voltage is provided by the driving unit. For example, an n-channel MOSFET can be used here, which can be brought into its conductor state by applying a positive voltage or a positive potential to its gate terminal.

In order to decouple the circuit breaker driving terminal from the first driving unit output terminal only with such a delay that a discharge of the above-mentioned capacitance is possible, it is further proposed that a discharge voltage source be associated with the discharge MOSFET component, wherein the discharge voltage source is configured to maintain the discharge MOSFET component for a predefined time in its conductor state after the end of the providing of the driving voltage by the driving unit. For example, the discharge voltage source may comprise an RC circuit.

According to another aspect of the present invention, it is proposed that a second decoupling circuit component be associated with the auxiliary driving unit, wherein the second decoupling circuit component is arranged between the first driving unit output terminal and the auxiliary driving unit output terminal, and wherein the second decoupling circuit component decouples the auxiliary driving unit output terminal from the first driving unit output terminal when driving voltage is not provided by the driving unit and auxiliary driving voltage is provided by the auxiliary driving unit. In this way, it is ensured that when the auxiliary driving unit generates the auxiliary driving voltage and applies same to the circuit breaker component driving terminal, the auxiliary driving unit output terminal is decoupled from the first driving unit output terminal, which is, e.g., maintained at the potential of the circuit breaker component output terminal.

Provisions may be made, for example, for the second decoupling circuit component to comprise a second decoupling MOSFET component, the gate terminal of which is connected to the first driving unit output terminal preferably via a diode, the source terminal of which is connected to the first driving unit output terminal and the drain terminal of which is connected to the auxiliary driving unit output terminal at least when auxiliary driving voltage is provided by the auxiliary driving unit.

A very simple embodiment can be achieved by means of merging functions by the discharge circuit component providing the second decoupling circuit component.

In order to avoid a charge caused by external effects at the circuit breaker component driving terminal when the circuit breaker component is in its diode state, it is proposed that the auxiliary driving unit be configured to connect the circuit breaker component driving terminal to the circuit breaker component output terminal or/and to a ground potential terminal when the circuit breaker component is in its diode state. This can be achieved, for example, by the auxiliary driving unit being configured to connect the auxiliary driving unit output terminal to the second auxiliary driving unit input terminal when the circuit breaker component is in its diode state.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

BRIEF DESCRIPTION OF THE DRAWINGS

In the drawings:

FIG. 1 is a circuit diagram of a circuit breaker device, e.g., for a vehicle electrical system.

DESCRIPTION OF THE PREFERRED EMBODIMENTS

Referring to the drawings, a circuit breaker device, which can be used, for example, in a vehicle, to couple a voltage source into the electrical system or to be able to connect to consumers provided in a vehicle, is generally designated by 10 in FIG. 1. The circuit breaker device 10 comprises, in the example shown, as a circuit breaker component 14 a circuit breaker MOSFET component 16, which may be configured as an n-channel MOSFET.

The circuit breaker component 14 has a circuit breaker component input terminal, which is generally designated by 18 and which may correspond, for example, to the drain terminal 20 of the circuit breaker MOSFET component 16. Further, the circuit breaker component 14 has a circuit breaker component output terminal 22, which may correspond to the source terminal 24 of the circuit breaker MOSFET component 16. The circuit breaker component 14 has further a circuit breaker component driving terminal 26, which may correspond to the gate terminal 28 of the circuit breaker MOSFET component 16.

When integrated into a vehicle, the input terminal 18 or the drain terminal 20 may be coupled with a vehicle battery and thus be, for example, at a potential of +12 V. The output terminal 22 or the source terminal 24 can be connected to one or more consumers of electrical energy or to the ground potential via same.

A driving unit, which is generally designated by 30, is associated with the circuit breaker component 14. This driving unit 30 is configured to apply a voltage or a potential to the circuit breaker component driving terminal 26 or to the gate terminal 28 or to apply a corresponding voltage between the circuit breaker component driving terminal 26 and the circuit breaker component output terminal 22. For this purpose, the driving unit 30 has a first driving unit output terminal 32, which is, in principle, connected to the circuit breaker component driving terminal 26, and has a second driving unit output terminal 34, which is connected to the circuit breaker component output terminal 22. The voltage applied by the driving unit 30 to the circuit breaker component output terminal 22 is, for example, in the range of 6 V to 8 V above the switching voltage or threshold voltage of the circuit breaker MOSFET component 16, so that by applying this driving voltage to the circuit breaker component output terminal 22, the circuit breaker component 14 is brought into its conductor state, in which the circuit breaker component 14 is, in principle, conductive, and the circuit breaker component input terminal 18 is thus connected at low resistance to the circuit breaker component output terminal 22. If this driving voltage is not applied to the circuit breaker component driving terminal 26, the circuit breaker component 14 is in a diode state. In case of configuration of the circuit breaker component 14 with a circuit breaker MOSFET component 16, this diode state is, in principle, provided because of the intrinsic diode present in such a component and indicated by the reference number 36. This diode is switched between the circuit breaker component input terminal 18 and the circuit breaker component output terminal 22 in the blocked direction, so that, when the potential at the circuit breaker component input terminal 18 (a positive potential being generally referred to here) is above the potential at the circuit breaker component output terminal 22, the circuit breaker component 14, which is maintained, in principle, in the diode state, is in a blocked state, while, when the potential at the circuit breaker component output terminal 22 is above the potential at the circuit breaker component input terminal 18, the circuit breaker MOSFET component 16 is in a conductive state or an on state, in which a voltage drop in the range of 0.6 V occurs via the intrinsic diode.

It should be pointed out here that a plurality of such circuit breaker components 14, for example, each composed of one or more circuit breaker MOSFET components 16, may be provided, for example, connected in parallel. Such a circuit breaker component 14 could also be configured as a so-called Q diode. Such a Q diode may also, in principle, be switched over between a conductor state and a diode state and has, e.g., an input terminal corresponding to a drain terminal, an output terminal corresponding to a source terminal as well as a driving terminal, corresponding to a gate terminal, and possibly also a ground terminal.

The circuit breaker device 10 further comprises an auxiliary driving unit, which is generally designated by reference number 38. The auxiliary driving unit 38 has a first auxiliary driving unit input terminal 40, which is connected to the circuit breaker component input terminal 18, and has a second auxiliary driving unit input terminal 42, which is connected to the circuit breaker component output terminal 22. Except for this coupling to the two terminals 18, 22 of the circuit breaker component 14, the auxiliary driving unit 38 is preferably not coupled to any other voltage source. The auxiliary driving unit 38 has further an auxiliary driving unit output terminal 44, via which the auxiliary driving unit 38 can apply an auxiliary driving voltage to the circuit breaker component driving terminal 26 or can apply a corresponding voltage between the circuit breaker component output terminal 22 and the circuit breaker component driving terminal 26.

A first decoupling circuit component, which is generally designated by 46, is associated with the auxiliary driving unit 38. This first decoupling circuit component 46 may comprise, for example, a first decoupling MOSFET component 48, which is, for example, configured as a p-channel MOSFET, has a drain terminal 50 connected to the auxiliary driving unit output terminal 44, a source terminal 52 connected to the circuit breaker component driving terminal 26 as well as a gate terminal 56 connected via a diode 54 to the first driving unit output terminal 32. The first decoupling circuit component 46 is thus, in principle, in a blocked state or diode state, in which the auxiliary driving unit output terminal 44 is decoupled from the circuit breaker component driving terminal 26, when the driving voltage provided by the driving unit 30 to the first driving unit output terminal 32 via the diode 54 is applied to the circuit breaker component driving terminal 26 and also to the gate terminal 56 as well as to the source terminal 52 of the decoupling MOSFET component 48. In this way, the auxiliary driving unit output terminal 44 is protected against the driving voltage provided to the first driving unit output terminal 32 especially in phases in which the circuit breaker component 14 is switched into its conductor state.

A discharge circuit component, which is generally designated by 58, is further associated with the circuit breaker component 14 and the circuit breaker component driving terminal 26. This discharge circuit component 58 may be composed of, for example, a discharge MOSFET component 60, which is connected to the first driving unit output terminal 32 by its source terminal 62, is connected to the circuit breaker component driving terminal 26 by its drain terminal 64 and is connected to the first driving unit output terminal 32 by its gate terminal 66 via the diode 54. If the driving voltage is generated by the driving unit 30 or a corresponding potential is provided to the first driving unit output terminal 32, then this potential is applied to the gate terminal 66 of the discharge MOSFET component 60 via the diode 54, which discharge MOSFET component 60 is configured, for example, as an n-channel MOSFET. The driving voltage is also applied to the source terminal 62, so that the discharge MOSFET component 60 remains in its diode state because of the absence of a potential difference between the gate terminal 66 and the source terminal 62. The driving voltage in this state is applied via the intrinsic diode 67 of the discharge MOSFET component 60 to the circuit breaker component driving terminal 26, so that the circuit breaker component 14 is switched into its conductor state.

A discharge voltage source, which is generally designated by 68, is further associated with the discharge circuit component 58. This discharge voltage source 68 comprises an RC circuit 70 with a capacitor 72 and a resistor 74 connected parallel to it. The RC circuit 70 is switched between the gate terminal 66 of the discharge MOSFET component 60 and the second driving unit output terminal 34 or the circuit breaker component output terminal 22, which can be connected, for example, via the already mentioned consumers to the ground potential.

When driving voltage is applied, the capacitor 72 of the RC circuit 70 is charged. If the application of the driving voltage is ended, then this would mean, in principle, that the discharge circuit component 58 in its diode state prevents a discharge of the gate capacitance of the circuit breaker component driving terminal 26 or of the gate terminal 28. Since, however, a voltage being applied to the gate terminal 66 is first provided by the discharge voltage source 68, the discharge MOSFET component 60 is switched into its conductor state, so that the gate terminal 28 can be discharged via the discharge circuit component 58 and the first driving unit output terminal 32. The discharge voltage source 68 is configured such that the voltage provided by same is maintained until the gate capacitance of the gate terminal 28 is essentially entirely discharged via the first driving unit output terminal 32 or does not fall below the switching voltage or threshold voltage of the discharge MOSFET component 60.

At the same time, the discharge circuit component 58 also provides a second decoupling circuit component 76, so that the discharge MOSFET component 60 is equally active as a second decoupling MOSFET component 78. When no driving voltage is generated by the driving unit 30, this second decoupling circuit component 76 is, in principle, in its diode state, in which it decouples the circuit breaker component driving terminal 26 from the first driving unit output terminal 32. Because the auxiliary driving unit output terminal 44 is connected or can be connected via the first decoupling circuit component 46 to the circuit breaker component driving terminal 26, it is in a state, in which the first decoupling circuit component 46 is in its conductor state and the second decoupling circuit component 76 is in its diode state, and the source terminal 52 of the first decoupling MOSFET component 48 and thus also the auxiliary driving unit output terminal 44 are decoupled from the first driving unit output terminal 32. This guarantees that, when, as described below, the auxiliary driving unit 38 generates an auxiliary driving voltage, the auxiliary driving unit output terminal 44 may remain at a correspondingly high potential or may apply this potential to the circuit breaker component driving terminal 26.

Should the voltage source or the high potential thereof connected to the circuit breaker component input terminal 18 by the circuit breaker device 10 be applied to a consumer coupled with the circuit breaker component output terminal 22, then the driving voltage is generated in the manner described above by the driving unit 30 and a corresponding potential is applied to the circuit breaker component driving terminal 26. Due to the voltage or potential difference present between the circuit breaker component driving terminal 26 and the circuit breaker component output terminal 22, the circuit breaker component 14 is switched into its conductor state. The auxiliary driving unit 38 is decoupled by the first decoupling circuit component 48 in this state from the circuit breaker component driving terminal 26 and likewise from the first driving unit output terminal 32.

Should the connection between the voltage source and the consumer or consumers be interrupted, the application of the driving voltage is ended. The circuit breaker component driving terminal 26 can be discharged via the discharge circuit component 58, so that the circuit breaker component 14 passes over into its diode state, in which it is in its blocked state in case of a fundamentally correct function, i.e., it decouples the higher potential at the circuit breaker component input terminal 18 from the lower potential at the circuit breaker component output terminal 24.

Error states or operating error states may occur in a vehicle, in which the potential being applied to the circuit breaker component output terminal 22 exceeds the potential being applied to the circuit breaker component input terminal 18, i.e., the voltage provided by the voltage source. This may be the case, for example, when, because of an operating error, a battery charger is connected to the circuit breaker component output terminal 22, which provides a higher voltage than the battery or voltage source connected to the circuit breaker component input terminal 18. In this case, the potential at the circuit breaker component output terminal 22 is higher than the potential at the circuit breaker component input terminal 18, so that the circuit breaker component 14, which is maintained, in principle, in its diode state, is operated in the forward conducting direction and thus a flow of current takes place from the circuit breaker component output terminal 22 to the circuit breaker component input terminal 18 and further in the direction towards the voltage source. Because of the voltage drop of approx. 0.6 V occurring here in the circuit breaker MOSFET component 16 and the possible currents in the range of up to 30 A also in this case, a comparatively high power loss occurs, which may lead to a substantial heating of the circuit breaker component 14 and possibly to a damage to same. If a defect would also occur in the area of the driving unit 30 at the same time in such a state, for example, a loss of ground or an uncoupling of same from the voltage supply, then the driving unit 30 would also not be capable of generating the driving voltage and consequently of bringing the circuit breaker component 14 into its conductive state in order to substantially reduce the power loss in the circuit breaker component 14 and thus the heating thereof.

In order to counter this problem, the auxiliary driving unit 38 is configured such that it, because of its connection to the circuit breaker component input terminal 18 and the circuit breaker component output terminal 22, detects the occurrence of such a potential difference or reversed voltage in the circuit breaker component 14 and, when such a voltage drop occurs in the circuit breaker component 14 with intrinsic diode 36 acted upon in the forward conducting direction, it provides an auxiliary driving voltage to the auxiliary driving unit output terminal 44. In this connection, the auxiliary driving unit 38 can be configured to multiply the voltage being applied between the two auxiliary driving unit input terminals 40, 42, so that, for example, the voltage of, for example, 0.6 V occurring at the circuit breaker component 14 during the forward conduction operation of the intrinsic diode 36 and tapped by the auxiliary driving unit 38 is converted into a voltage in the range of 6 V and is applied as a corresponding auxiliary driving voltage to the circuit breaker component driving terminal 26 via the first decoupling circuit component 46, which is maintained in its conductor state in this state. As a result, the circuit breaker component 14 is switched into its conductor state, so that only a negligible voltage drop occurs in the circuit breaker component 14 and a continued heating of the circuit breaker component 14 is avoided.

The auxiliary driving voltage provided by the auxiliary driving unit 38 is applied to the circuit breaker component driving terminal 26 via the intrinsic diode 57 of the first decoupling MOSFET component 48 and the source terminal 52 thereof, which diode is active in the forward conducting direction in this state. Because of the potential difference occurring here between the source terminal 52 and the gate terminal 56, the first discharge MOSFET component 48 is switched into its conductor state and thus the auxiliary driving voltage is applied via the low-resistance first discharge MOSFET component 48 to the gate terminal 28 of the circuit breaker component 14.

When the auxiliary driving voltage is applied to the circuit breaker component driving terminal 26 and in case of the dropping of the voltage also induced thereby or potential difference between the two auxiliary driving unit input terminals 40, 42, in order to prevent the circuit breaker component 14 from immediately again reaching its diode state because of the no longer present potential difference between the circuit breaker component input terminal 18 and the circuit breaker component output terminal 22, the auxiliary driving unit 38 can, for example, be configured such that the auxiliary driving voltage is generated via a capacitor 82 or a corresponding assembly unit or is applied to the circuit breaker component driving terminal 26. In this case, the time constant may be such that the ratio of charge time to the discharge time is in the range of 2/98, i.e., approx. 2% of the time is needed to charge this capacitor 82 and thus to be able to provide the auxiliary driving voltage, while the circuit breaker component 14 can then be maintained in its conductor state over 98% of the time by means of the auxiliary driving voltage. The time for such a cycle can be fixed by selection of the capacitor 82. A constant switching over between the conductor state and the diode state thus takes place, and, because of the circumstance that the circuit breaker component 14 is in its diode state only during the markedly shorter percentage of the time, the time phases in which the heating, which is to be avoided, may occur per se, are comparatively short.

In addition to the above-described functionality to provide an auxiliary driving voltage from the voltage drop occurring in the area of the circuit breaker component 14 itself, the auxiliary driving unit 38 also provides a functionality to discharge the circuit breaker component driving terminal 26 or gate terminal 28 of the circuit breaker MOSFET component 16 when the circuit breaker component 14 is in its diode state. In this state, the circuit breaker component driving terminal 26, i.e., the gate terminal 28, is, in principle, decoupled from the driving unit 30 by means of the discharge circuit component 58. It is possible, e.g., due to unfavorable external effects, that the circuit breaker component input terminal 26 is charged. In order to avoid this, the auxiliary driving unit 38 has a discharge functionality, in which, when no auxiliary driving voltage is generated, the source terminal 50 of the first decoupling circuit component 46 is connected to the second auxiliary driving input terminal 42 via a connection 80, indicated in FIG. 1, and to the circuit breaker component output terminal 22 via this driving input terminal 42. This discharge functionality can be used both when in the diode state of the circuit breaker component 14, the intrinsic diode 36 of which is active in the blocked direction, i.e., the potential at the drain terminal 20 is higher than the potential at the source terminal 22, and when the intrinsic diode 36 is conductive in the case of the voltage reversal, but the auxiliary driving unit 38 does not generate any auxiliary driving voltage, during a charging phase of the capacitor 82. In this state, an improved switching behavior of the circuit breaker component 14 when auxiliary driving voltage is applied is achieved due to the improved discharging of the gate capacitance of the gate terminal 28.

In conclusion, it should be pointed out that the above-described functionality of the auxiliary driving unit 38 can be provided, for example, by a component marketed by the company Texas Instruments (trademark) under the trade name "LM74610-Q1 ZERO IQ REVERSE POLARITY PROTECTION SMART DIODE DRIVINGLER." In case of integration into a circuit breaker device described above with reference to FIG. 1, this component can provide both the functionality to generate the auxiliary driving voltage and the functionality to discharge the circuit breaker component driving terminal.

While specific embodiments of the invention have been shown and described in detail to illustrate the application of the principles of the invention, it will be understood that the invention may be embodied otherwise without departing from such principles.

What is claimed is:

1. A circuit breaker device for a vehicle electrical system, the circuit breaker device comprising:
   a circuit breaker component comprising a circuit breaker component input terminal, a circuit breaker component output terminal and a circuit breaker component driving terminal, wherein the circuit breaker component is in a conductor state when a driving voltage is applied to the circuit breaker component driving terminal and the circuit breaker component is in a diode state when the driving voltage is not applied to the circuit breaker component driving terminal such that the circuit breaker component is in a blocked state when the circuit breaker component input terminal is at a higher potential than the circuit breaker component output terminal;

a driving unit providing the driving voltage to be applied to the circuit breaker component driving terminal; and an auxiliary driving unit providing an auxiliary driving voltage to be applied to the circuit breaker component driving terminal, wherein the auxiliary driving unit is configured to generate the auxiliary driving voltage on the basis of a voltage drop between the circuit breaker component input terminal and the circuit breaker component output terminal when the circuit breaker component is in the circuit breaker component diode state and the circuit breaker component output terminal is at a higher potential than the circuit breaker component input terminal, wherein the auxiliary driving unit has a first auxiliary driving unit input terminal connected to the circuit breaker component input terminal and a second auxiliary driving unit input terminal connected to the circuit breaker component output terminal, and the auxiliary driving unit is configured to multiply a potential difference present between the two auxiliary driving unit input terminals for providing the auxiliary driving voltage.

2. A circuit breaker device in accordance with claim 1, wherein the circuit breaker component comprises a circuit breaker MOSFET component, wherein the circuit breaker component driving terminal corresponds to a gate terminal of the circuit breaker MOSFET component, the circuit breaker component input terminal corresponds to a drain terminal of the circuit breaker MOSFET component and the circuit breaker component output terminal corresponds to a source terminal of the circuit breaker MOSFET component.

3. A circuit breaker device in accordance with claim 1, wherein:
the driving unit has a first driving unit output terminal for applying the driving voltage to the circuit breaker component driving terminal; or
the auxiliary driving unit has an auxiliary driving unit output terminal for applying the auxiliary driving voltage to the circuit breaker component driving terminal; or
the driving unit has a first driving unit output terminal for applying the driving voltage to the circuit breaker component driving terminal and the auxiliary driving unit has an auxiliary driving unit output terminal for applying the auxiliary driving voltage to the circuit breaker component driving terminal.

4. A circuit breaker device in accordance with claim 3, further comprising a decoupling circuit component associated with the auxiliary driving unit output terminal, wherein the decoupling circuit component decouples the auxiliary driving unit output terminal from the circuit breaker component driving terminal when the driving voltage provided by the driving unit is applied to the circuit breaker component driving terminal.

5. A circuit breaker device in accordance with claim 4, further comprising a diode, wherein the decoupling circuit component comprises a decoupling MOSFET component with a gate terminal, which is connected to the first driving unit output terminal via the diode, with a drain terminal, which is connected to the auxiliary driving unit output terminal and with a source terminal, which is connected to the circuit breaker component driving terminal.

6. A circuit breaker device in accordance with claim 4, wherein the decoupling circuit component is a first decoupling circuit component and further comprising a second decoupling circuit component associated with the auxiliary driving unit, wherein the second decoupling circuit component is arranged between the first driving unit output terminal and the auxiliary driving unit output terminal, and wherein the second decoupling circuit component decouples the auxiliary driving unit output terminal from the first driving unit output terminal when the driving voltage is not provided by the driving unit and the auxiliary driving voltage is provided by the auxiliary driving unit.

7. A circuit breaker device in accordance with claim 6, further comprising a diode, wherein the first decoupling circuit component comprises a decoupling MOSFET component with a gate terminal, which is connected to the first driving unit output terminal via the diode, with a drain terminal, which is connected to the auxiliary driving unit output terminal and with a source terminal, which is connected to the circuit breaker component driving terminal.

8. A circuit breaker device still in accordance with claim 7, further comprising another diode, wherein the decoupling MOSFET component is a first decoupling MOSFET component and the second decoupling circuit component comprises a second decoupling MOSFET component with a gate terminal connected to the first driving unit output terminal via the other diode, with a source terminal connected to the first driving unit output terminal and with a drain terminal connected to the auxiliary driving unit output terminal when auxiliary driving voltage is provided by the auxiliary driving unit.

9. A circuit breaker device in accordance with claim 3, further comprising a discharge circuit component associated with the circuit breaker component driving terminal, wherein:
the discharge circuit component is arranged between the first driving unit output terminal and the circuit breaker component driving terminal, and the driving unit applies the driving voltage to the circuit breaker component driving terminal via the discharge circuit component;
the circuit breaker component driving terminal can be discharged via the discharge circuit component when the driving voltage is not provided by the driving unit.

10. A circuit breaker device in accordance with claim 9, further comprising a diode wherein:
the discharge circuit component comprises a discharge MOSFET component with a gate terminal connected to the first driving unit output terminal via the diode, with a source terminal connected to the first driving unit output terminal and with a drain terminal connected to the circuit breaker component driving terminal:
the discharge MOSFET component is in a diode state when driving voltage is provided by the driving unit.

11. A circuit breaker device in accordance with claim 9, further comprising a decoupling circuit component associated with the auxiliary driving unit, wherein the decoupling circuit component is arranged between the first driving unit output terminal and the auxiliary driving unit output terminal, and wherein the decoupling circuit component decouples the auxiliary driving unit output terminal from the first driving unit output terminal when the driving voltage is not provided by the driving unit and the auxiliary driving voltage is provided by the auxiliary driving unit and wherein the discharge circuit component provides the decoupling circuit component.

12. A circuit breaker device in accordance with claim 10, wherein:
   a discharge voltage source is associated with the discharge MOSFET component;
   the discharge voltage source is configured to maintain the discharge MOSFET component in a conductor state for a predefined time after ending the providing of driving voltage by the driving unit.

13. A circuit breaker device in accordance with claim 12, wherein the discharge voltage source comprises an RC circuit.

14. A circuit breaker device in accordance with claim 3, further comprising a decoupling circuit component associated with the auxiliary driving unit, wherein the decoupling circuit component is arranged between the first driving unit output terminal and the auxiliary driving unit output terminal, and wherein the decoupling circuit component decouples the auxiliary driving unit output terminal from the first driving unit output terminal when the driving voltage is not provided by the driving unit and the auxiliary driving voltage is provided by the auxiliary driving unit.

15. A circuit breaker device still in accordance with claim 14, further comprising a diode, wherein the decoupling circuit component comprises a decoupling MOSFET component with a gate terminal connected to the first driving unit output terminal via the diode, with a source terminal connected to the first driving unit output terminal and with a drain terminal connected to the auxiliary driving unit output terminal when auxiliary driving voltage is provided by the auxiliary driving unit.

16. A circuit breaker device in accordance with claim 1, wherein the driving unit has a second driving unit output terminal connected to the circuit breaker component output terminal.

17. A circuit breaker device in accordance with claim 1, wherein:
   the auxiliary driving unit is configured to connect the circuit breaker component driving terminal to the circuit breaker component output terminal when the circuit breaker component is in its diode state or
   the auxiliary driving unit is configured to connect the circuit breaker component driving terminal to a ground potential terminal when the circuit breaker component is in its diode state; or
   the auxiliary driving unit is configured to connect the circuit breaker component driving terminal to the circuit breaker component output terminal when the circuit breaker component is in its diode state and the auxiliary driving unit is configured to connect the circuit breaker component driving terminal to a ground potential terminal when the circuit breaker component is in its diode state.

18. A circuit breaker device in accordance with claim 17, wherein the auxiliary driving unit is configured to connect the auxiliary driving unit output terminal to the auxiliary driving unit input terminal when the circuit breaker component is in the diode state.

19. A circuit breaker device in accordance with claim 18, wherein the auxiliary driving unit is configured to connect the auxiliary driving unit output terminal to the auxiliary driving unit input terminal when the circuit breaker component is in the diode state.

20. A circuit breaker device for a vehicle electrical system, the circuit breaker device comprising:
   a circuit breaker component comprising a circuit breaker component input terminal, a circuit breaker component output terminal and a circuit breaker component driving terminal, wherein the circuit breaker component is in a conductor state when a driving voltage is applied to the circuit breaker component driving terminal and the circuit breaker component is in a diode state when the driving voltage is not applied to the circuit breaker component driving terminal such that the circuit breaker component is in a blocked state when the circuit breaker component input terminal is at a higher potential than the circuit breaker component output terminal;
   a driving unit providing the driving voltage to be applied to the circuit breaker component driving terminal; and
   an auxiliary driving unit providing an auxiliary driving voltage to be applied to the circuit breaker component driving terminal, wherein the auxiliary driving unit is configured to generate the auxiliary driving voltage on the basis of a voltage drop between the circuit breaker component input terminal and the circuit breaker component output terminal when the circuit breaker component is in the circuit breaker component diode state and the circuit breaker component output terminal is at a higher potential than the circuit breaker component input terminal, the driving unit having a second driving unit output terminal connected to the circuit breaker component output terminal.

* * * * *